(12) United States Patent
Doyle

(10) Patent No.: US 6,828,830 B2
(45) Date of Patent: Dec. 7, 2004

(54) LOW POWER, AREA-EFFICIENT CIRCUIT TO PROVIDE CLOCK SYNCHRONIZATION

(75) Inventor: Brent Raymond Doyle, Malabar, FL (US)

(73) Assignee: Intersil Americas, Inc., Milpitas, CA (US)

( * ) Notice: Subject to any disclaimer, the term of this patent is extended or adjusted under 35 U.S.C. 154(b) by 0 days.

(21) Appl. No.: 10/634,284

(22) Filed: Aug. 5, 2003

(65) Prior Publication Data

US 2004/0164781 A1 Aug. 26, 2004

Related U.S. Application Data

(60) Provisional application No. 60/448,760, filed on Feb. 20, 2003.

(51) Int. Cl.[7] .............................................. H03K 17/00
(52) U.S. Cl. ...................................... 327/99; 327/407
(58) Field of Search ........................... 327/99, 20, 298, 327/144, 403, 18, 293–297, 407

(56) References Cited

U.S. PATENT DOCUMENTS 4,982,116 A * 1/1991 Lee ............................. 327/144
5,142,247 A * 8/1992 Lada et al. .................... 331/14
5,475,324 A * 12/1995 Tomiyori ...................... 327/145
5,604,452 A * 2/1997 Huang ........................... 327/99
5,828,243 A * 10/1998 Bagley ......................... 327/99
6,396,324 B1 * 5/2002 Hsu et al. .................... 327/298

* cited by examiner

*Primary Examiner*—Minh Nguyen
(74) *Attorney, Agent, or Firm*—Allen, Dyer, Doppelt, Milbrath & Gilchrist, P.A.

(57) ABSTRACT

A clock signal generator, which requires no clock selection pin includes a multiplexer to which external and internal clocks are applied. The external clock is further coupled directly and via an inverting delay to a logic circuit, the output of which controls a switching device connected across a capacitor. The capacitor is coupled to a current source and to a comparator that is coupled to a reference voltage. The comparator output serves as the select control for the multiplexer. The switching device repeatedly discharges the capacitor in response to the external clock signal, but otherwise allows the capacitor to be charged by the current source. The external clock signal is coupled to the output of the multiplexer, as long as the capacitor is repeatedly discharged by the external clock signal at a frequency sufficient to maintain the voltage across the capacitor less than the reference voltage.

5 Claims, 2 Drawing Sheets

LOW POWER, AREA-EFFICIENT CIRCUIT TO PROVIDE CLOCK SYNCHRONIZATION

CROSS-REFERENCE TO RELATED APPLICATION

The present application claims the benefit of U.S. application Ser. No. 60/448,760, filed Feb. 20, 2003, now abandoned, by Brent Doyle, entitled: "Low Power, Area-Efficient Circuit to Provide Clock Synchronization," assigned to the assignee of the present application and the disclosure of which is incorporated herein.

FIELD OF THE INVENTION

The present invention relates, in general, to electronic systems and circuits therefor, and is particularly directed to a clock generator circuit for controllably asserting either an internal or an external clock for chip circuitry synchronization.

BACKGROUND OF THE INVENTION

Many integrated circuits, such as, but not limited to power management pulse width modulators, employ an internal clock generator. In some applications it is desirable to override the internally generated clock with an external clock to provide synchronization with other electronics in the system. It is desirable to do this without having to add a ""clock selected" or control" pin to select an internal vs. an external clock, i.e., it is desirable to "sense" the presence of an external clock signal, and use it for the internal clock.

SUMMARY OF THE INVENTION

In accordance with the present invention, this objective is readily accomplished by means of a relatively low power, circuit real estate area-efficient, clock signal generator that detects the presence of an externally sourced clock, and then uses this clock as the clock for internal chip circuitry. The present invention is able to provide synchronization from a relatively low frequency range on the order of several Hertz (the lower limit being set by device leakage and size of an electrical energy storage capacitor) to hundreds of MHz (the upper limit being set by gate delays of the fabrication technology employed).

For this purpose, the present invention comprises a clock steering circuit in the form of a multiplexer having a first input to which an External Clock signal may be applied, and a second input to which an Internal Clock signal is applied. The external clock input port is further coupled to an inverting delay and to a first input of a logic circuit (e.g., an AND gate or a NAND gate). The output of the inverting delay is coupled to a second input of the logic circuit. The logic circuit has its output coupled to the control input of a switching device. The switching device has a current flow path therethrough coupled to a current source/sink, and in parallel with an electrical energy storage device, in the form of a capacitor that is also coupled to the current source/sink. The connection of the current source/sink and the capacitor is coupled to one input of a comparator, which has a second input coupled to a reference voltage. The output of the comparator is coupled to the select port of the multiplexer. The current supplied by the current source and the value of the capacitor are selected so that the time required for the comparator to reach its trip threshold is defined by $N/f_{internal\ clock\ frequency}$. This allows the circuit to synchronize to an external clock that is as slow as $1/N$ times $f_{internal\ clock\ frequency}$.

In operation, if an external clock having a frequency higher that a prescribed minimum or 'override' frequency is applied to the input port, the controlled switching device will be turned ON sufficiently often, to effectively prevent the capacitor from charging to a voltage value that will trip the comparator. For this 'external override' condition, the output of the comparator will remain in a first logical state, that will cause the External Clock signal to be coupled by the multiplexer to all chip logic circuitry requiring a clock signal. On the other hand, if no effective external clock is applied to the external clock input port the switching device is never turned on so that the capacitor is not discharged. This allows the voltage across the capacitor to attain a value that will trip the comparator, and change the select input to the multiplexer. In this case, the multiplexer couples the Internal Clock to the clock bus. It may be noted that external clock frequencies above 0 but less than $1/N$ would be outside the recommended design specification range and would produce an output clock signal that jitters between internal and external clock.

DETAILED DESCRIPTION

Figure 1:
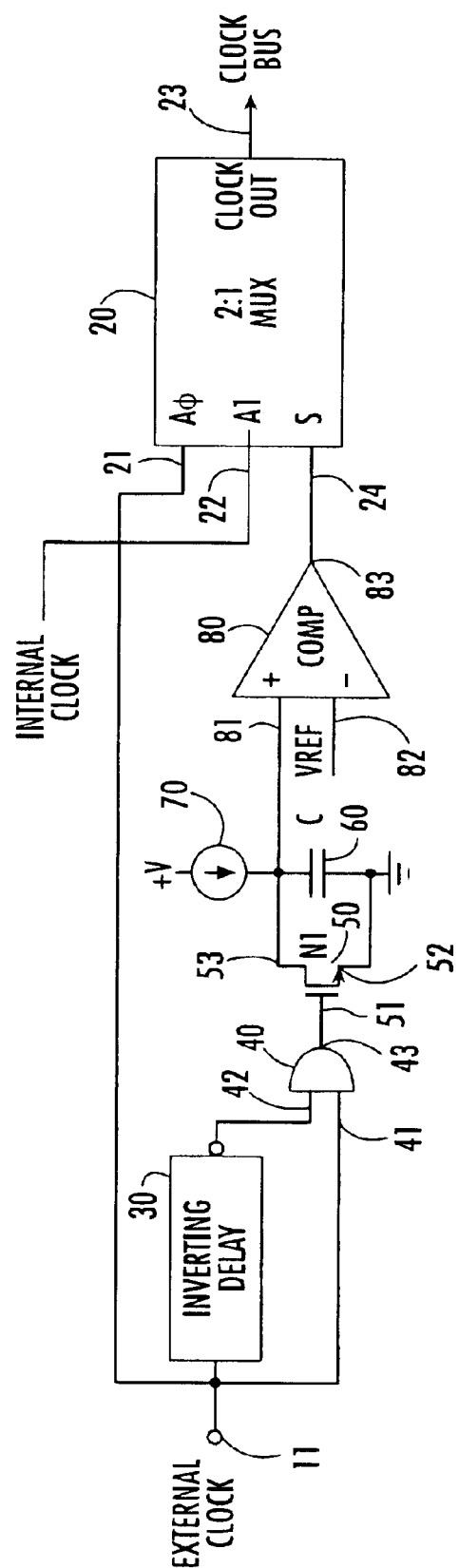
FIG. 1 diagrammatically illustrates a circuit for controllably asserting one of an internal clock and an external clock in accordance with a first embodiment of the invention.

Before describing in detail the new and improved clock generator circuit in accordance with the present invention, it should be observed that the invention resides primarily in a prescribed modular arrangement of conventional digital circuits and components therefor. In a practical implementation that facilitates their being packaged in a hardware-efficient configuration, this arrangement may be readily implemented as a field programmable gate array (FPGA), or application specific integrated circuit (ASIC) chip set. Consequently, the configuration of such arrangement of circuits and components and the manner in which they are interfaced with other electronic circuitry have, for the most part, been illustrated in the drawings by readily understandable block diagrams, which show only those specific details that are pertinent to the present invention, so as not to obscure the disclosure with details which will be readily apparent to those skilled in the art having the benefit of the description herein. Thus, the block diagram illustrations are primarily intended to show the major components of the invention in a convenient functional grouping, whereby the present invention may be more readily understood.

Referring now to FIG. 1, the architecture of a first embodiment of a clock generator in accordance with the present invention is diagrammatically illustrated as comprising an input port 11, to which an external clock signal denoted External Clock is coupled. Input port is coupled to a first (A0) input port 21 of a 2:1 multiplexer 20, to an inverting delay circuit 30 and to a first input 41 of a logic circuit (e.g., an AND gate) 40. The output of the inverting delay circuit 30 is coupled to a second input 42 of AND gate 40. The output 43 of AND gate 40 is coupled to the control input of a controlled switching device, shown in FIG. 1 as the gate input 51 of an N-channel MOSFET 50. Alternatively, switching device 50 may comprise a bipolar transistor or other equivalent component.

NMOSFET 50 has its drain-source path coupled in parallel with a capacitor 60 and to a current source 70, which sources current from the chip power supply, +V. The source 52 of NMOSFET 50 and one side of the capacitor 60 are coupled to ground, while the drain 53 of NMOSFET 50 and the other side of capacitor 60 are coupled to a first, non-inverting (+) input 81 of a comparator 80 and the current source 70. Comparator 80 has its inverting (−) input 82 coupled to receive a reference voltage VREF and its output 83 coupled to the select (S) input 24 of multiplexer 20. A second input 22 of multiplexer 20 is coupled to the chip's internal clock source that supplies a clock denoted Internal Clock, while the output 23 of multiplexer 20 is coupled to all chip logic circuitry requiring a clock signal. The steering path through multiplexer 20 is such that, for a select input 24 of '0', multiplexer 20 couples its first input 21 (to which the external clock is coupled) to its output port 23, while for a select input 24 of '1', multiplexer 20 couples its second input 22 (to which the internal clock is coupled) to its output port 23.

Operation of the circuit of FIG. 1 is as follows. For the case that an effective external clock is applied to input port 11, then at each rising edge of the external clock (or complementarily, on each falling edge of the external clock, if AND gate 40 is replaced by a NOR gate), NMOSFET 50 is turned ON, discharging capacitor 60, which had been previously been charging by the current supplied from current source 70. As long as the frequency of the external clock signal applied to input port 11 is higher that a prescribed minimum or 'override' frequency, NMOSFET 50 will be turned ON sufficiently often, such that capacitor 60 will not have time to charge up to a value that will allow the voltage at the first input 81 of comparator 80 to rise above the reference voltage VREF.

As noted briefly above, the current supplied by the current source 70 and the value of capacitor 60 are selected such that the time required for the voltage being supplied to the non-inverting (+) input 81 of comparator 80 is defined by $N/f_{internal\ clock\ frequency}$. This allows synchronization to an external clock that is as slow as $1/N$ times $f_{internal\ clock\ frequency}$. For the 'external override' condition, the output 83 of comparator 80 will remain in a first logical state (e.g., a logical '0') so that the select input 24 of multiplexer 20 remains at that value, causing the External Clock signal, that is coupled from input port 11 to the input 21 of multiplexer 20, to be coupled via its output port 23 to all chip logic circuitry requiring a clock signal.

For the case that no effective external clock is applied to the input port 11, the NMOSFET 50 is never turned ON, so that capacitor 60 is not discharged. This will enable the non-inverting (+) input 81 of comparator 80 to increase to a value that exceeds the reference voltage VREF, thereby causing the output 83 of comparator to go high (logical '1'). This, in turn, causes multiplexer 20 to couple the Internal Clock supplied to its input 22 to its output 23 and the system clock bus, as intended.

Figure 2:
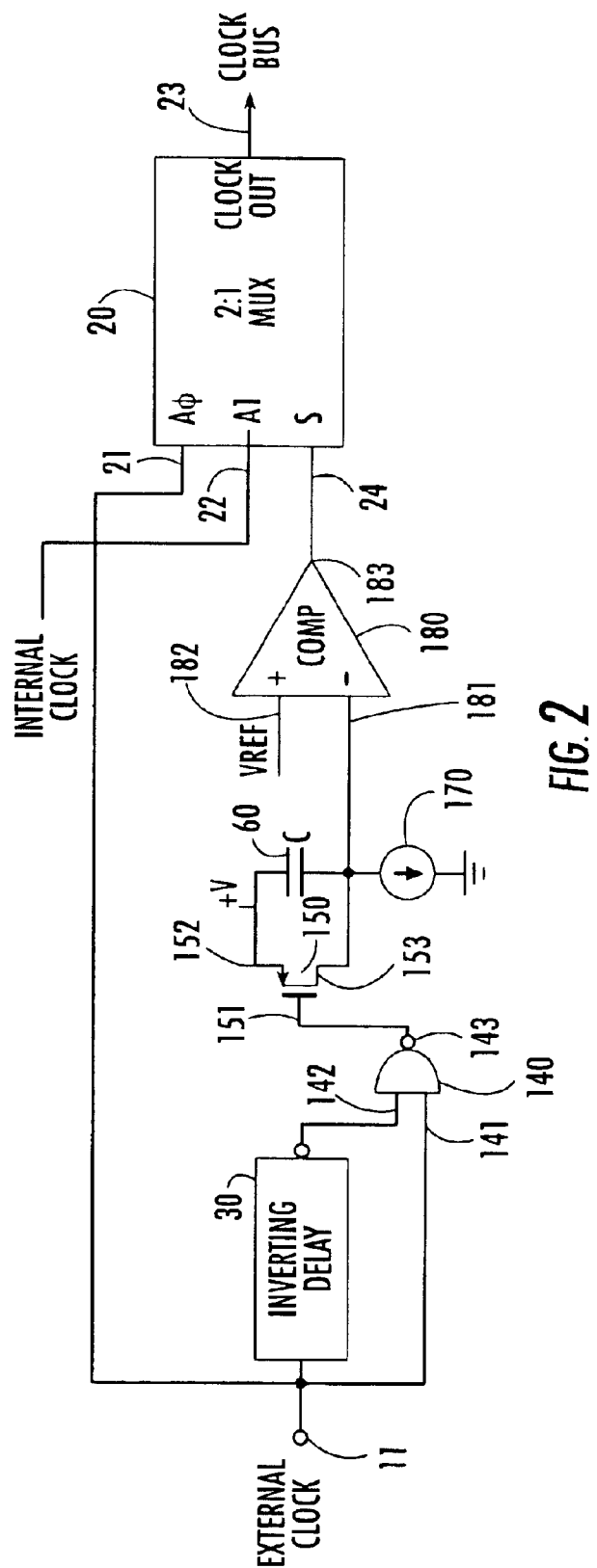
FIG. 2 diagrammatically illustrates a circuit for controllably asserting one of an internal clock and an external clock in accordance with a second embodiment of the invention.

FIG. 2 diagrammatically illustrates an alternative (complementary) embodiment of the clock selection architecture of FIG. 1, where polarities have been reversed. Again, the input port 11, to which the External Clock signal is coupled, is coupled to a first (A0) input port 21 of a 2:1 multiplexer and to an inverting delay circuit 30. The External Clock signal is also coupled to first input 141 of a NAND gate 140. The output of the inverting delay circuit 30 is coupled to a second input 142 of NAND gate 140. The output 143 of NAND gate 140 is coupled to the gate input 151 of a P-channel MOSFET 150. PMOSFET 150 has its drain-source path coupled in parallel with capacitor 60 and to a current sink 170, which is coupled to ground. The source 152 of NMOSFET 150 and one side of the capacitor 60 are coupled to a +V volts voltage rail, while the drain 153 of PMOSFET 150 and the other side of capacitor 60 are coupled to a first, inverting (−) input 181 of a comparator 180. Comparator 180 has its non-inverting (+) input 182 coupled to reference voltage VREF and output 183 coupled to the select (S) input 24 of multiplexer 20.

The operation of the complementary polarity version of the invention shown in FIG. 2 is essentially the same as that of the embodiment of FIG. 1, except that the current source 170 applies a negative current to (or sinks current from) the capacitor 60, which is controllably discharged by NAND gate 140 turning on PMOSFET 150. As in the embodiment of FIG. 1, as long as the frequency of the external clock signal is higher that a prescribed minimum 'override' frequency, PMOSFET 150 will be turned ON sufficiently often, such that capacitor 60 will not have time to be charged to a value that will allow the voltage at the first input 181 of comparator 180 to fall below Vref and cause the comparator's output to change state (e.g., 0 to 1), whereby the select input 24 of multiplexer 20 remains at a value that causes the external clock signal at input port 21 to be coupled to its output port 23 and the clock bus.

On the other hand, if no external clock is applied to input port 11, PMOSFET 150 is never turned ON. This will cause the inverting (−) input 181 of comparator 180 to decrease to a value lower than the reference voltage VREF, thereby causing the output 83 of comparator to go high (logical '1'). Again, as described above, this will cause multiplexer 20 to couple the Internal Clock supplied to its input 22 to its output 23 and the clock bus, as intended.

As will be appreciated from the foregoing description, the desire to override an internally generated clock with an external clock to provide synchronization with various electronic circuits of an integrated circuit chip, and without having to add a separate "control" pin to select an internal vs. an external clock, i.e., is successfully addressed by the clock generator circuit of the present invention which, detects the presence of an externally sourced clock, and then couples this clock to the internal chip circuitry. As noted previously, the clock generator of the invention affords synchronization from a relatively low frequency range on the order of several Hertz (the lower limit being set by device leakage and capacitor size) to hundreds of MHz (the upper limit being set by gate delays of the fabrication technology employed).

While I have shown and described several embodiments in accordance with the present invention, it is to be understood that the same is not limited thereto but is susceptible to numerous changes and modifications as known to a person skilled in the art. I therefore do not wish to be limited to the details shown and described herein, but intend to cover all such changes and modifications as are obvious to one of ordinary skill in the art.

What is claimed is:

1. A method for controllably asserting a clock signal on a clock signal bus of an integrated circuit comprising the steps of:

in the absence of a first clock signal being coupled to a prescribed conductor of said integrated circuit, coupling a second clock signal as a default clock signal to said clock signal bus of said integrated circuit; and in response to said first clock signal being coupled to said prescribed conductor of said integrated circuit, interrupting the coupling of said second clock signal to said clock signal bus of said integrated circuit and, in place thereof, coupling said first clock signal to said clock signal bus of said integrated circuit, further including the steps of:

storing electrical energy in an electrical storage device;

controlling the energy storage state of said electrical storage device in accordance with whether or not said first clock signal is coupled to said prescribed conductor of said integrated circuit, and controllably coupling one of said first clock signal and said second clock signal to said clock signal bus, in accordance with the energy storage state of said electrical storage device; and wherein said electrical energy storage device comprises a capacitor which stores electrical energy provided by way of a current source coupled thereto, and wherein the step of controlling the energy storage state of said electrical storage device comprises repeatedly discharging said capacitor in accordance with said first clock signal, but otherwise allowing said capacitor to be charged, and wherein the step of interrupting the coupling of said second clock signal to said clock signal bus of said integrated circuit comprises causing said first clock signal to be coupled to said clock signal bus, in response to a voltage developed across said capacitor being less than a predetermined reference voltage, wherein the step of controlling the energy storage state of said electrical storage device comprises generating a delayed version of first external clock signal and controllably discharging said capacitor in accordance with a prescribed logical relationship between said first clock signal and said delayed version of said first clock signal.

2. A circuit for controllably asserting either an internal clock signal or an external clock signal on a clock signal bus of an integrated circuit comprising:

an internal clock signal transport path that is operative, in the absence of said external clock signal being coupled to a prescribed conductor of said integrated circuit, to couple said internal clock signal as a default clock signal to said clock signal bus of said integrated circuit; and an external clock signal transport path that is operative, in response to said external clock signal being coupled to said prescribed conductor of said integrated circuit, to interrupt the coupling of said internal clock signal to said clock signal bus of said integrated circuit in and, in place thereof, to couple said external clock signal to said clock signal bus of said integrated circuit, further including:

an electrical storage device which stores electrical energy supplied thereto;

a discharge control circuit which is operative to control the energy storage state of said electrical storage device in accordance with whether or not said external clock signal is coupled to said prescribed conductor of said integrated circuit, and wherein said internal and external clock signal transport paths are operative to controllably couple one of said external clock signal and said internal clock signal to said clock signal bus, in accordance with the energy storage state of said electrical storage device, wherein said electrical energy storage device comprises a capacitor which stores electrical energy provided by way of a current source coupled thereto, and wherein said discharge control circuit is operative to repeatedly discharge said capacitor in accordance with said external clock signal, but otherwise allow said capacitor to be charged, and wherein said external clock signal transport path is operative to cause said external clock signal to be coupled to said clock signal bus, in response to a voltage developed across said capacitor being less than a predetermined reference voltage, and wherein said discharge control circuit is operative to generate a delayed version of external clock signal and controllably discharge said capacitor in accordance with a prescribed logical relationship between said external clock signal and said delayed version of said external clock signal.

3. A clock signal generator that is exclusive of a clock selection pin comprising a multiplexer having a first input to which an external clock signal is applied and a second input to which an internal clock signal is applied, said external clock signal being further coupled to an inverting delay and to a first input of a logic circuit, the output of said inverting delay being coupled to a second input of said logic circuit, said logic circuit having an output thereof coupled to a control input of a switching device, said switching device having a current flow path coupled to a current source and in parallel with an electrical energy storage device, and wherein a common connection between said current source and said electrical energy storage device is coupled to a first input of a comparator, said comparator having a second input coupled to receive a reference voltage, and an output coupled to a select port of said multiplexer, and wherein said switching device is operative to repeatedly discharge said electrical energy storage device in accordance with said external clock signal, but to otherwise allow the electrical energy storage device to be charged by the current source, so that said external clock signal is coupled to the output of said multiplexer, as long as the electrical energy storage device is repeatedly discharged by said external clock signal at a frequency sufficient to maintain the voltage across said electrical energy storage device less than a prescribed reference voltage.

4. The clock signal generator according to claim 3, wherein said electrical energy storage device comprises a capacitor which stores electrical energy provided by way of said current source coupled thereto.

5. The clock signal generator according to claim 4, wherein said switching device is operative to repeatedly discharge said capacitor in accordance with application of said external clock signal to said first input of said multiplexer, but to otherwise allow said capacitor to be charged by said current source.

* * * * *